(12) United States Patent
Muntean

(10) Patent No.: US 12,349,284 B2
(45) Date of Patent: Jul. 1, 2025

(54) ELECTROOPTICAL DISPLAY DEVICE

(71) Applicant: Continental Automotive Technologies GmbH, Hannover (DE)

(72) Inventor: Marius-Andrei Muntean, Timisoara (RO)

(73) Assignee: Continental Automotive Technologies GmbH, Hannover (DE)

( * ) Notice: Subject to any disclaimer, the term of this patent is extended or adjusted under 35 U.S.C. 154(b) by 165 days.

(21) Appl. No.: 18/218,811

(22) Filed: Jul. 6, 2023

(65) Prior Publication Data
US 2024/0015941 A1    Jan. 11, 2024

(30) Foreign Application Priority Data
Jul. 7, 2022    (EP) .................................... 22465543

(51) Int. Cl.
*H05K 10/00*    (2006.01)
*H05K 3/32*    (2006.01)

(52) U.S. Cl.
CPC ............. *H05K 10/00* (2013.01); *H05K 3/328* (2013.01); *H05K 2201/10128* (2013.01)

(58) Field of Classification Search
CPC .................. H05K 10/00; H05K 3/328; H05K 2201/10128
USPC ..................................................... 361/679.01
See application file for complete search history.

(56) References Cited

U.S. PATENT DOCUMENTS

| | | |
|---|---|---|
| 2013/0127897 A1 | 5/2013 | Baker et al. |
| 2020/0010949 A1* | 1/2020 | Washio ............. C23C 16/45544 |
| 2021/0271016 A1 | 9/2021 | Arihara et al. |
| 2022/0412519 A1* | 12/2022 | Coquelle ................. F21S 8/022 |

FOREIGN PATENT DOCUMENTS

| | | |
|---|---|---|
| DE | 202021100684 U1 | 3/2021 |
| DE | 102020215822 A1 | 6/2022 |
| JP | 2021-135416 A | 9/2021 |

OTHER PUBLICATIONS

Search Report dated Dec. 13, 2022 from corresponding European patent application No. 22465543.1.
Office Action (Notice to Submit Response) issued May 2, 2025, by the Korean Intellectual Property Office in corresponding Korean Patent Application No. 10-2023-0075075 and an English translation of the Office Action. (7 pages).

* cited by examiner

*Primary Examiner* — Binh B Tran
(74) *Attorney, Agent, or Firm* — Buchanan Ingersoll & Rooney PC

(57) ABSTRACT

An electrooptical display device comprising an electrooptical display and a plurality of foils which are arranged on one of another and the plurality of foils is situated in front of the electrooptical display, so that the plurality of foils is situated between the electrooptical display and a possible viewer or observer of the electrooptical display device is disclosed. The foils comprise centering features for centering the foils in a frame of the electrooptical display device and the foils are connected by a linking.

8 Claims, 2 Drawing Sheets

A - A

B - B

ELECTROOPTICAL DISPLAY DEVICE

CROSS REFERENCE TO RELATED APPLICATION

This U.S. patent application claims the benefit of European patent application No. EP 22465543.1, filed Jul. 7, 2022, which is hereby incorporated by reference.

SUMMARY

The present disclosure refers to an electrooptical display device comprising an electrooptical display and a plurality of foils arranged on one of another and the plurality of foils are situated in front of the electrooptical display, so that the plurality of foils is situated between the electrooptical display and a possible viewer or observer of the electrooptical display device. These foils are used for example to improve the uniformity of the brightness of the electrooptical display and/or to enlarge or reduce a possible viewing angle from which the content of information displayed on the electrooptical display is viewable for an observer of the electrooptical display. These foils comprise centering features that shall keep the optical foils in place. Since the space allowed for the displays is more and more reduced, especially in automotive applications, the thickness of the electrooptical display device is so small that a frame of the electrooptical display device comprising centering features may have a thickness of about 0.6 mm. Furthermore, in automotive applications there are made vibration tests so that the foils are not kept perfect in their planned position so that friction marks appear and create black uniformity problems. The task of the present disclosure is to improve the positioning of the foils and their remaining in the planned area even during vibration tests. This task is received by that the foils are connected together by a linking. This linking may be provided by any possible linking-measure usable for linking two or more foils together like for example by using a glue to link the foils together.

Preferably the linking of the foils is done by welding the foils together.

If the foils are welded together in the region of the centering features these regions become robust and may easy work together with the centering features of the electrooptical display device.

If the foils comprise a bulge this bulge may work as centering feature together with a recess of the electrooptical display device for the centering.

By that the foils are positioned with the bulges of adjacent foils arranged one of another these bulges become strong elements for the centering.

If the bulges are welded together the resulting bulges are perfect for the centering and the welding area can be outside the visible area of the foils so that the image displayed by the electrooptical display is not influenced by any welding structures.

A good centering result is reached by that the bulges are positioned in recesses positioned in the electrooptical display device.

One good position for the recesses is reached if the recesses are positioned in a backplate of the electrooptical display device. This backplate should be in a defined position and might have a direct connection to the electrooptical display.

BRIEF DESCRIPTION OF THE DRAWINGS

The disclosure is now described with a possible construction of a special preferred embodiment.

DETAILED DESCRIPTION

Figure 1:
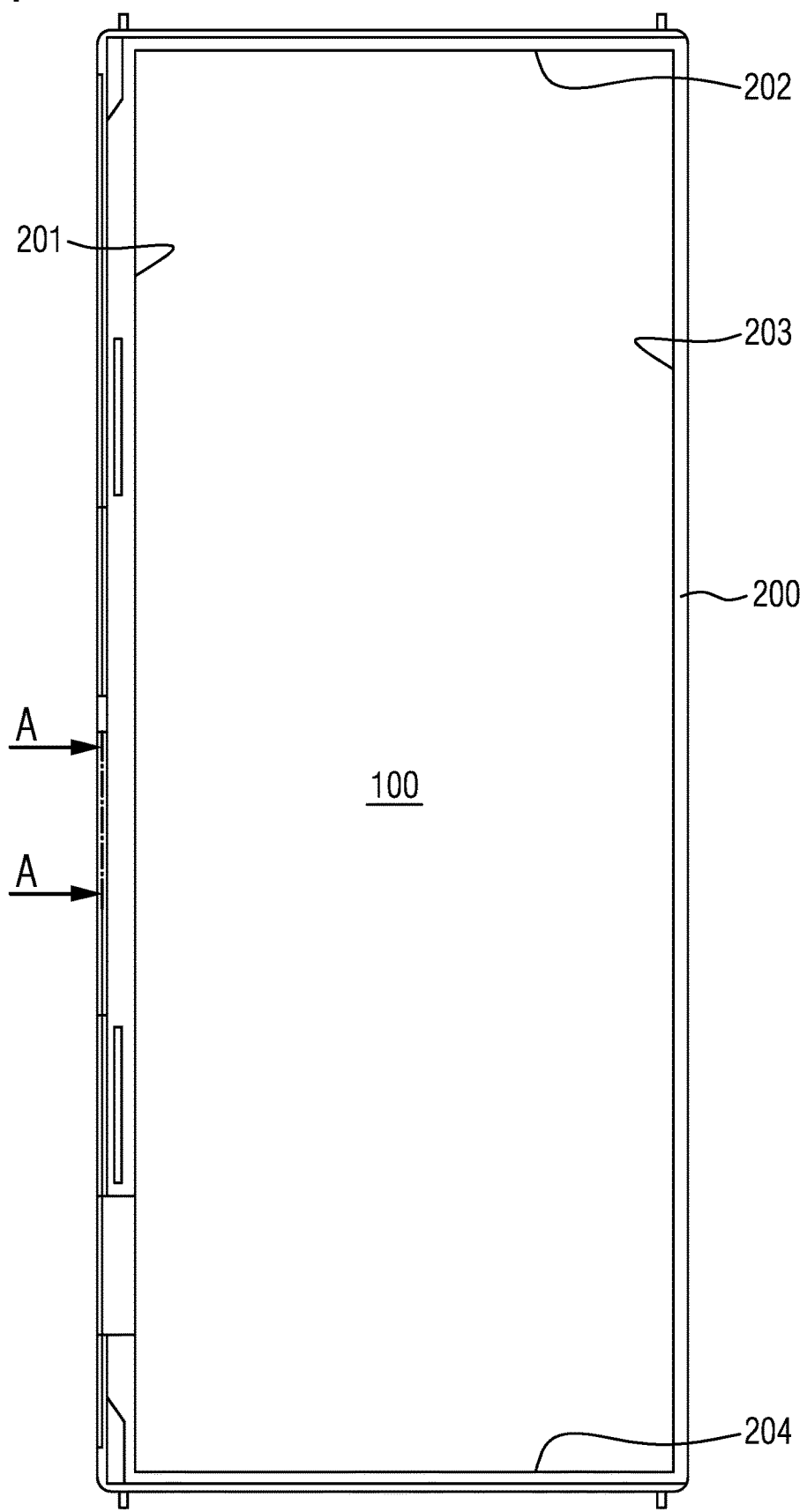
FIG. 1 shows a view of an electrooptical display device for an especially preferred example of the disclosure.

In FIG. 1 one can see an electrooptical display device 1 comprising a topmost foil 100 and a frame 200. The frame comprises inner limits 201, 202, 203, 204. Under die topmost foil 100 are situated some more foils (see in FIG. 2) and below the foils the electrooptical display is arranged so that images displayed by the electrooptical display are visible in the area surrounded by the frame200 since the foils (100 in FIG. 1) do not block the light emitted by the electrooptical display, they only form the light in determined, wished boundaries.

Figure 2:
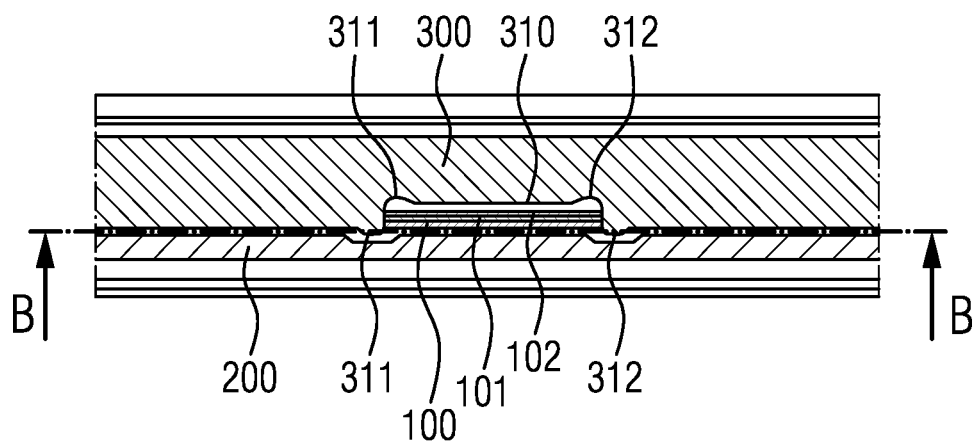
FIG. 2 shows the cut A-A of FIG. 1.
Figure 3:
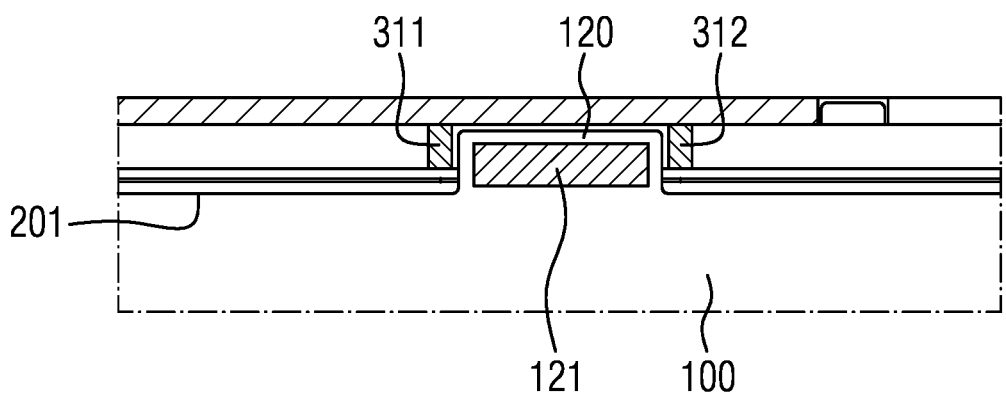
FIG. 3 shows the cut B-B of FIG. 2.

In FIGS. 2 and/or 3 one may see the Foil 100 and Foils 101, 102. The displayed parts of these foils form a bulge 120, which comprises a welding area 121. In this welding area 121 the foils 100, 101, 102 are welded together and make the bulge 120 very strong. A Backplate 300 of the electrooptical display device 1 comprises a recess 310 with boundaries 311, 312. The bulge 120 is positioned inside the recess 310. The bulge 120 is covered by the frame 200. In this manner the foils 100, 101, 102 are positioned on the right place and by the welding in welding area 121 prevented from moving against each other. Preferably there are more than the one displayed bulge present to optimize the positioning and remaining of the foils 100, 101, 102 in their position even under strong movements of the electrooptical display device 1 In some applications one single bulge 120 may be sufficient. Furthermore, the electrooptical display device 1 may be covered by a not shown transparent cover, which may be bonded to the foil 100 and the frame 200 by optical bonding. and gives additional security.

The invention claimed is:
1. An electrooptical display device, the electrooptical display device comprising:
    an electrooptical display; and
    a plurality of foils arranged on one of another, wherein the plurality of foils being situated in front of the electrooptical display, so that the plurality of foils is situated between the electrooptical display and a possible viewer or observer of the electrooptical display device, wherein the foils comprise centering features for centering the foils in a frame of the electrooptical display device, and wherein the foils are connected by a linking.
2. The electrooptical display device according to claim 1, wherein the linking of the foils is a welding, which welds the foils together.
3. The electrooptical display device according to claim 2, wherein the foils are welded together in the region of the centering features.
4. The electrooptical display device according to claim 1, wherein the foils comprise a bulge as part of the centering feature.
5. The electrooptical display according to claim 4, wherein the foils are positioned with the bulges of adjacent foils arranged one of another.
6. The electrooptical display according to claim 5, wherein the bulges are welded together.
7. The electrooptical display according to claim 6, wherein the bulges are positioned in recesses positioned in the electrooptical display device.

8. The electrooptical display according to claim 7, wherein the recesses are positioned in a backplate of the electrooptical display.

* * * * *